(12) United States Patent
Pellizzer et al.

(10) Patent No.: US 9,608,042 B2
(45) Date of Patent: Mar. 28, 2017

(54) ELECTRODE CONFIGURATIONS TO INCREASE ELECTRO-THERMAL ISOLATION OF PHASE-CHANGE MEMORY ELEMENTS AND ASSOCIATED TECHNIQUES

(71) Applicant: INTEL CORPORATION, Santa Clara, CA (US)

(72) Inventors: Fabio Pellizzer, Boise, ID (US); Giulio Albini, Boise, ID (US); Stephen W. Russell, Boise, ID (US); Max F. Hineman, Boise, ID (US); Sanjay Rangan, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/017,552

(22) Filed: Feb. 5, 2016

(65) Prior Publication Data

US 2016/0233271 A1 Aug. 11, 2016

Related U.S. Application Data

(63) Continuation of application No. 14/552,205, filed on Nov. 24, 2014, now Pat. No. 9,299,747.

(51) Int. Cl.
*H01L 45/00* (2006.01)
*H01L 27/24* (2006.01)

(52) U.S. Cl.
CPC ...... *H01L 27/2463* (2013.01); *H01L 27/2427* (2013.01); *H01L 45/06* (2013.01);
(Continued)

(58) Field of Classification Search
CPC . H01L 45/06; H01L 45/1206; H01L 45/1253; H01L 45/16
(Continued)

(56) References Cited

U.S. PATENT DOCUMENTS

2007/0249090 A1  10/2007 Philipp et al.
2008/0237566 A1  10/2008 An et al.
(Continued)

FOREIGN PATENT DOCUMENTS

KR  10-2008-0009397 A  1/2008
KR  10-2008-0069761 A  7/2008
(Continued)

OTHER PUBLICATIONS

International Search Report and Written Opinion mailed Mar. 25, 2016, issued in corresponding International Application No. PCT/US2015/056757, 14 pages.
(Continued)

*Primary Examiner* — George Fourson, III
(74) *Attorney, Agent, or Firm* — Schwabe, Williamson & Wyatt, P.C.

(57) ABSTRACT

Embodiments of the present disclosure describe electrode configurations to increase electro-thermal isolation of phase-change memory elements and associated techniques. In an embodiment, an apparatus includes a plurality of phase-change memory (PCM) elements, wherein individual PCM elements of the plurality of PCM elements include a phase-change material layer, a first electrode layer disposed on the phase-change material layer and in direct contact with the phase-change material layer, and a second electrode layer disposed on the first electrode layer and in direct contact with the first electrode layer. Other embodiments may be described and/or claimed.

20 Claims, 11 Drawing Sheets

(52) U.S. Cl.
CPC .......... *H01L 45/065* (2013.01); *H01L 45/122* (2013.01); *H01L 45/124* (2013.01); *H01L 45/126* (2013.01); *H01L 45/1253* (2013.01); *H01L 45/141* (2013.01); *H01L 45/1608* (2013.01); *H01L 45/1666* (2013.01); *H01L 45/1675* (2013.01); *H01L 45/1206* (2013.01); *H01L 45/16* (2013.01); *H01L 2224/16225* (2013.01); *H01L 2924/15311* (2013.01)

(58) Field of Classification Search
USPC .......... 257/379, 776; 438/129, 210, 238, 382
See application file for complete search history.

(56) References Cited

U.S. PATENT DOCUMENTS

| | | |
|---|---|---|
| 2010/0210068 A1 | 8/2010 | Lee et al. |
| 2011/0278531 A1 | 11/2011 | Erbetta et al. |
| 2013/0277640 A1 | 10/2013 | Nishimura et al. |
| 2015/0069630 A1 | 3/2015 | Sciarrillo |

FOREIGN PATENT DOCUMENTS

| | | |
|---|---|---|
| KR | 10-2009-0090002 A | 8/2009 |
| KR | 10-2010-0032580 A | 3/2010 |
| KR | 10-2010-0090969 A | 8/2010 |

OTHER PUBLICATIONS

U.S. Appl. No. 14/497,801 filed Sep. 26, 2014, 31 pages.
Non-Final Office Action mailed Aug. 5, 2015, issued in corresponding U.S. Appl. No. 14/552,205, 6 pages.
Search Report of R.O.C., mailed Aug. 29, 2016, issued in corresponding Taiwan Patent Application No. 104133051.
Notice of Preliminary Rejection mailed Dec. 16, 2016, issued in corresponding Korean Patent Application No. 10-2015-0148125, 10 pages.

US 9,608,042 B2

ELECTRODE CONFIGURATIONS TO INCREASE ELECTRO-THERMAL ISOLATION OF PHASE-CHANGE MEMORY ELEMENTS AND ASSOCIATED TECHNIQUES

CROSS REFERENCE TO RELATED APPLICATION

The present application is a continuation application of U.S. patent application Ser. No. 14/552,205, filed Nov. 24, 2014, and entitled "ELECTRODE CONFIGURATIONS TO INCREASE ELECTRO-THERMAL ISOLATION OF PHASE-CHANGE MEMORY ELEMENTS AND ASSOCIATED TECHNIQUES," the entire disclosure of which is hereby incorporated by reference and for all purposes.

FIELD

Embodiments of the present disclosure generally relate to the field of integrated circuits, and more particularly, to electrode configurations to increase electro-thermal isolation of phase-change memory elements and associated techniques.

BACKGROUND

Phase-change memory (PCM) technology such as multi-stack cross-point PCM is a promising alternative to other non-volatile memory (NVM) technology. There exists a continuous drive to increase electro-thermal isolation of phase-change memory elements in order to optimize PCM operation including, for example, programming current and shape of a threshold voltage ($V_T$) to current (I) characteristic, $V_T$-I.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe electrode configurations to increase electro-thermal isolation of phase-change memory elements and associated techniques. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

Figure 1:
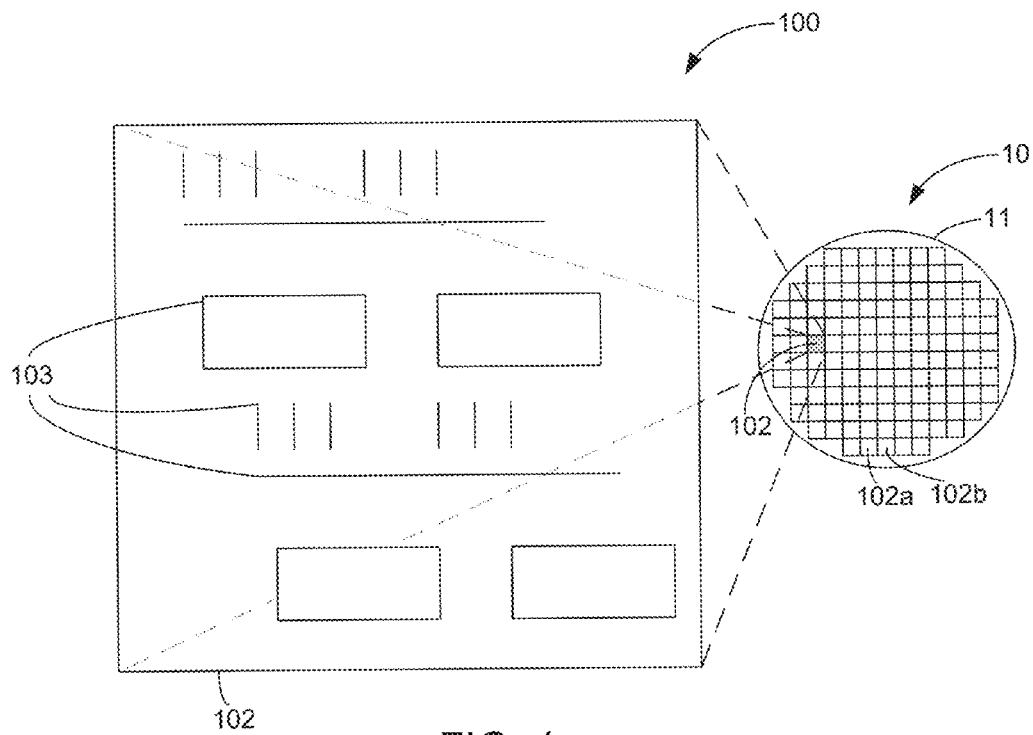
FIG. 1 schematically illustrates a top view of an example die in wafer form and in singulated form, in accordance with some embodiments.

FIG. 1 schematically illustrates a top view of an example die 102 in wafer form 10 and in singulated form 100, in accordance with some embodiments. In some embodiments, the die 102 may be one of a plurality of dies (e.g., dies 102, 102a, 102b) of a wafer 11 composed of semiconductor material such as, for example, silicon or other suitable material. The plurality of dies may be formed on a surface of the wafer 11. Each of the dies may be a repeating unit of a semiconductor product that includes a phase-change memory (PCM) device as described herein. For example, the die 102 may include circuitry 103 of a PCM device in accordance with some embodiments. According to various embodiments, the circuitry 103 may include one or more PCM elements (e.g., cells), which may be configured in an array. The PCM elements may include, for example, a phase-change material such as a chalcogenide glass that can be switched between crystalline and amorphous states with the application of heat produced by an electric current. The state (e.g., crystalline/amorphous) of the phase-change material may correspond with a logical value (e.g., 1 or 0) of the PCM elements. The circuitry 103 may be part of a PCM and switch (PCMS) device in some embodiments. That is, the PCM elements may include a switch such as, for example, an ovonic threshold switch (OTS) configured for use in selection/programming operations of the PCM elements.

The circuitry 103 may further include one or more bit-lines and one or more word-lines coupled to the PCM elements. The bit-lines and word-lines may be configured such that each of the PCM elements is disposed at an intersection of each individual bit-line and word-line, in some embodiments. A voltage or bias can be applied to a target PCM element of the PCM elements using the word-lines and the bit-lines to select the target cell for a read or write operation. Bit-line drivers may be coupled to the bit-lines and word-line drivers may be coupled to the word-lines to facilitate decoding/selection of the PCM elements. Capacitors and resistors may be coupled to the bit-lines and the word-lines. The circuitry 103 may include other suitable devices and configurations in some embodiments. For example, the circuitry 103 may include one or more modules that are configured to perform read, program, verify and/or analysis operations.

In some embodiments, the circuitry 103 may be formed using PCM fabrication techniques and/or other suitable semiconductor fabrication techniques. It is noted that the circuitry 103 is only schematically depicted in FIG. 1 and may represent a wide variety of suitable logic or memory in the form of circuitry including, for example, one or more state machines including circuitry and/or instructions in storage (e.g., firmware or software) configured to perform actions such as read, program, verify and/or analysis operations.

After a fabrication process of the semiconductor product is complete, the wafer 11 may undergo a singulation process in which each of the dies (e.g., dies 102, 102a, 102b) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the circuitry 103 may be disposed on a semiconductor substrate in wafer form 10 or singulated form 100. In some embodiments, the die 102 may include logic or memory, or combinations thereof.

Figure 2:
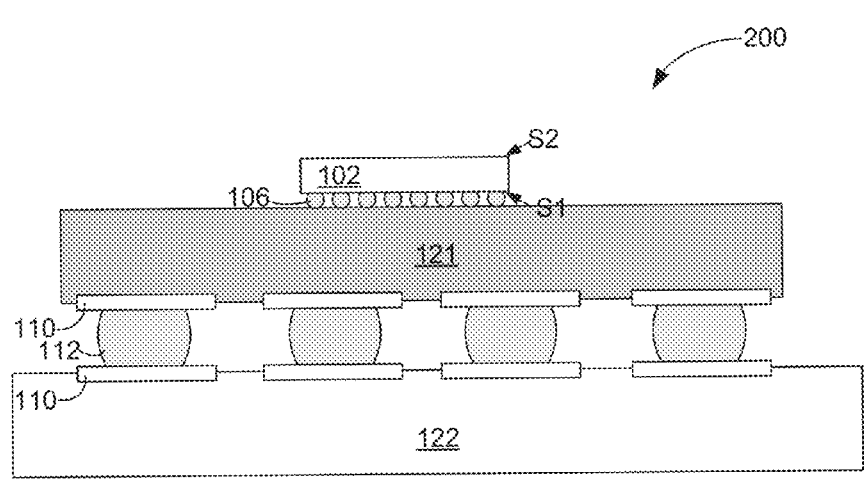
FIG. 2 schematically illustrates a cross-section side view of an integrated circuit (IC) assembly, in accordance with some embodiments.

FIG. 2 schematically illustrates a cross-section side view of an integrated circuit (IC) assembly 200, in accordance with some embodiments. In some embodiments, the IC assembly 200 may include one or more dies (hereinafter "die 102") electrically and/or physically coupled with a package substrate 121. The die 102 may include circuitry (e.g., circuitry 103 of FIG. 1) such as a PCM device as described herein. In some embodiments, the package substrate 121 may be coupled with a circuit board 122, as can be seen.

The die 102 may represent a discrete product made from a semiconductor material (e.g., silicon) using semiconductor fabrication techniques such as thin film deposition, lithography, etching and the like used in connection with forming PCM devices. In some embodiments, the die 102 may be, include, or be a part of a processor, memory, system-on-chip (SoC) or ASIC in some embodiments. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include circuitry such as, for example, PCM elements. An inactive side, S2, may be disposed opposite to the active side S1, as can be seen. In other embodiments, the die 102 may be disposed on another die that is coupled with the package substrate 121 in any of a variety of suitable stacked die configurations. For example, a processor die may be coupled with the package substrate 121 in a flip-chip configuration and the die 102 may be mounted on the processor die in a flip-chip configuration and electrically coupled with the package substrate using through-silicon vias (TSVs) formed through the processor die. In still other embodiments, the die 102 may be embedded in the package substrate 121 or coupled with a die that is embedded in the package substrate 121. Other dies may be coupled with the package substrate 121 in a side-by-side configuration with the die 102 in other embodiments.

In some embodiments, the die-level interconnect structures 106 may be configured to route electrical signals between the die 102 and the package substrate 121. The electrical signals may include, for example, input/output (I/O) signals and/or power/ground signals that are used in connection with operation of the die. The die-level interconnect structures 106 may be coupled with corresponding die contacts disposed on the active side S1 of the die 102 and corresponding package contacts disposed on the package substrate 121. The die contacts and/or package contacts may include, for example, pads, vias, trenches, traces and/or other suitable contact structures.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, package contacts (e.g., pads 110) disposed on one or more surfaces of the package substrate 121 and/or internal routing features (not shown) such as, for example, trenches, vias or other interconnect structures to route electrical signals through the package substrate 121.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1202 of FIG. 12).

Package-level interconnects such as, for example, solder balls 112 may be coupled to pads 110 on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. The package-level interconnect may include other structures and/or configurations including, for example, land-grid array (LGA) structures and the like.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3A:
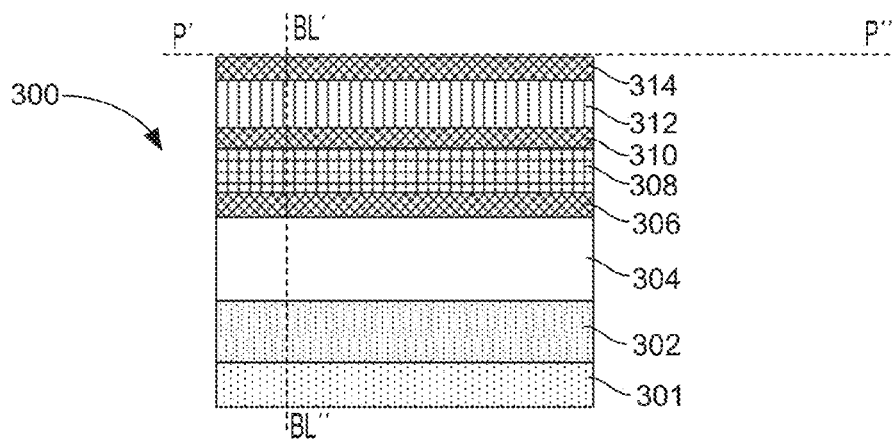
FIGS. 3A-B, 4A-B, 5A-B, 6A-B, 7A-B, 8A-B, 9A-B and 10A-B schematically illustrate cross-section side views of a phase-change memory (PCM) device during various stages of fabrication, in accordance with some embodiments.
Figure 3B:
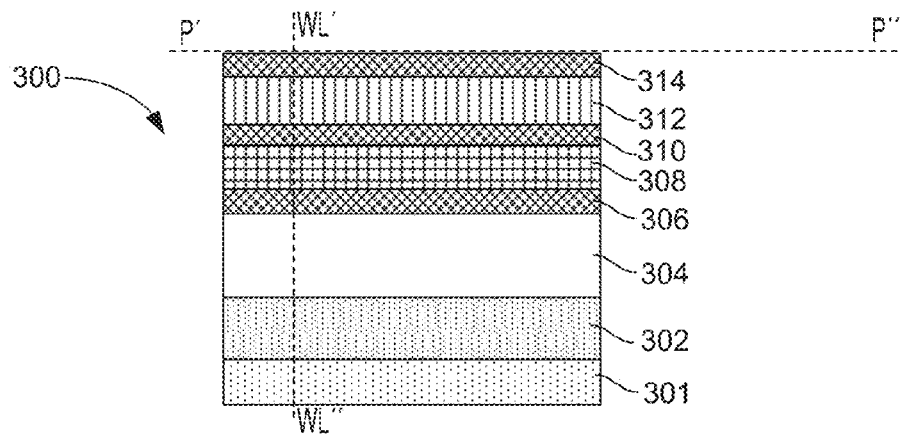
Figure 3C:
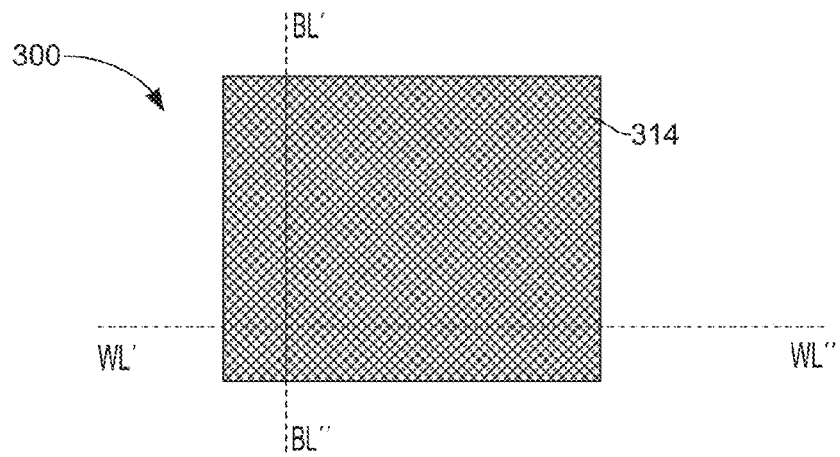
FIGS. 3C, 4C, 5C, 6C, 7C, 8C, and 9C schematically illustrate a top view of a phase-change memory (PCM) device during various stages of fabrication, in accordance with some embodiments.
Figure 4A:
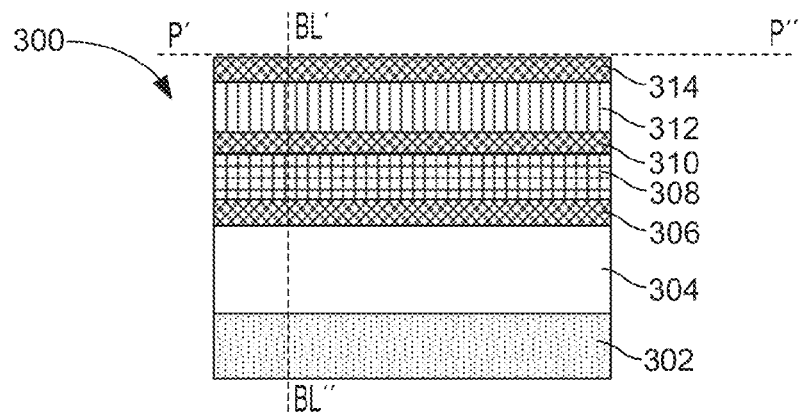
Figure 4B:
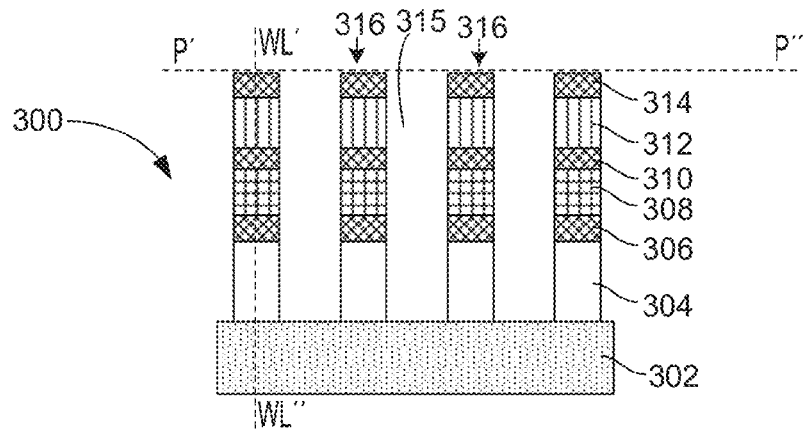
Figure 4C:
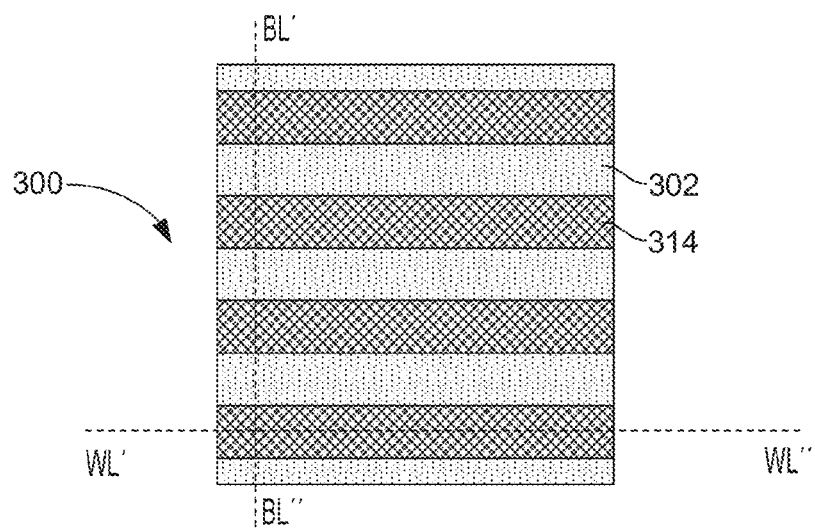
Figure 5A:
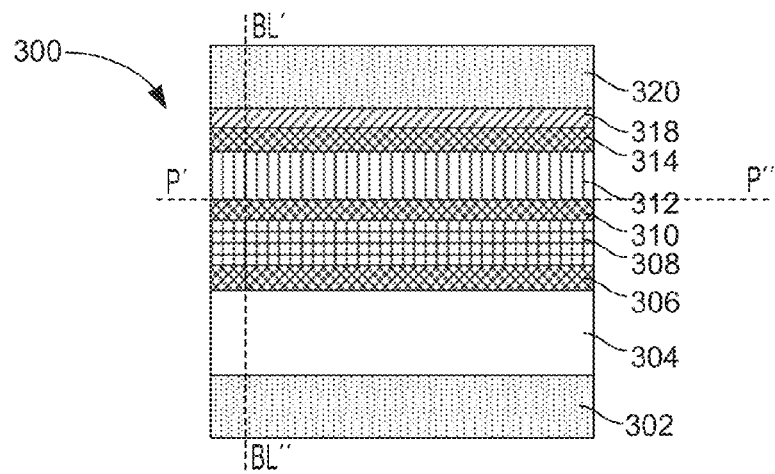
Figure 5B:
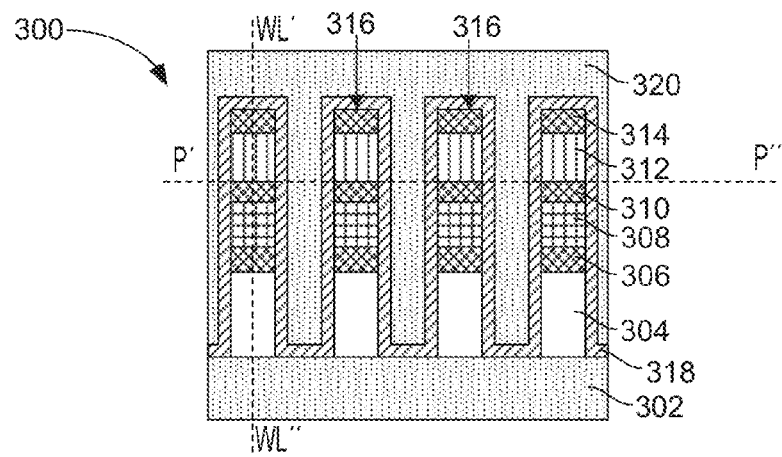
Figure 5C:
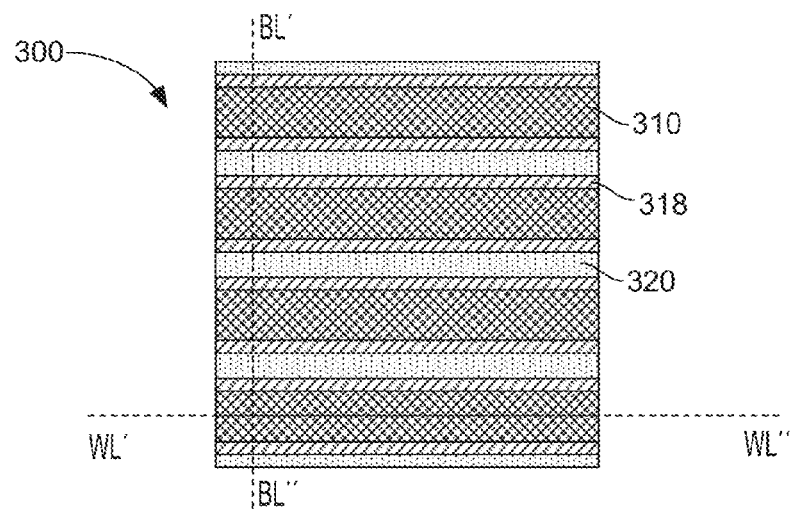

FIGS. 3A-B, 4A-B, 5A-B, 6A-B, 7A-B, 8A-B, 9A-B and 10A-B schematically illustrate cross-section side views of a phase-change memory (PCM) device during various stages of fabrication, in accordance with some embodiments. FIGS. 3A, 4A, 5A, 6A, 7A, 8A, 9A and 10A depict a cross-section side of the PCM device 300 from a same, first perspective and FIGS. 3B, 4B, 5B, 6B, 7B, 8B, 9B and 10B depict a cross-section side of the PCM device 300 from a same, second perspective that is perpendicular to the first perspective. FIGS. 3C, 4C, 5C, 6C, 7C, 8C, and 9C schematically illustrate a top view of the phase-change memory (PCM) device 300 during various stages of fabrication, in accordance with some embodiments. FIGS. 3A-C represent the PCM device 300 during a same stage of fabrication, FIGS. 4A-C represent the PCM device 300 during a same stage of fabrication, FIGS. 5A-C represent the PCM device 300 during a same stage of fabrication, and so forth. The indicators P'-P''', BL'-BL'' and WL'-WL'' are provided to facilitate understanding of the relative orientation between the different perspectives (e.g., FIGS. 3A-C). For example, FIG. 3A-9A may represent a cross-section along WL'-WL'', FIGS. 3B-9B may represent a cross-section along BL'-BL'', and FIGS. 3C-9C may represent a cross-section along P'-P'''.

Referring to FIGS. 3A-C, a PCM device 300 is depicted subsequent to depositing an electrically conductive material such as word-line metal 304 on a substrate 301 to form a word-line layer and depositing materials to form a stack of layers on the word-line metal 304. One or more intervening layers and/or structures (hereinafter "circuitry 302") may be disposed between the substrate 301 and the word-line metal 304. For example, the circuitry 302 may include complementary metal-oxide-semiconductor (CMOS) devices and/or metallization that are formed on the substrate 301 between the word-line metal 304 and the substrate 301. The substrate 301 may be a semiconductor substrate such as, for example, silicon in some embodiments. The substrate 301 is not shown in the remainder of the figures to avoid obscuring other aspects. The word-line metal 304 may include, for example, tungsten. Other suitable materials for the substrate 301 and the word-line metal 304 may be used in other embodiments.

The stack of layers may include a bottom electrode layer 306 disposed on the word-line metal 304, select device (SD) layer 308 disposed on the bottom electrode layer 306, middle electrode layer 310 disposed on the SD layer 308, phase-change material (PM) layer 312 disposed on the middle electrode layer 310, and a first top electrode layer (TE1) 314 disposed on the PM layer 312, as can be seen. Each layer of the stack of layers may be deposited according to any suitable technique.

According to various embodiments, the bottom electrode layer 306 may be composed of one or more conductive and/or semiconductive materials such as, for example, carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; and conductive metal oxides including $RuO_2$. The SD layer 308 may include a P-N diode, a MIEC (Mixed Ionic Electronic Conduction) device or an OTS (Ovonic Threshold Switch) based on chalcogenide alloys with composition including any one of the chalcogenide alloy systems described for the storage element (e.g., the PM layer 312) and, in addition, may further include an element that can suppress crystallization. The middle electrode layer 310 may be composed of one or more conductive and/or semiconductive materials such as, for example, carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; and conductive metal oxides including $RuO_2$. The PM layer 312 may be composed of a phase-change material such as a chalcogenide glass that can be switched between crystalline and amorphous states with the application of heat produced by an electric current such as an alloy including at least two of the elements among Germanium, Antimony, Tellurium, Silicon, Indium, Selenium, Sulphur, Nitrogen and Carbon. The first top electrode layer 314 may be composed of an electrically conductive material such as a metal or semi-metal (e.g., semiconductive material) having a resistivity ranging from 1 milli-Ohm·centimeter (mOhm·cm) to 100 mOhm·cm such as, for example, carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; and conductive metal oxides including $RuO_2$ The layers 306, 308, 310, 312 and 314 may be composed of other suitable materials having other suitable properties in other embodiments.

In some embodiments, the first top electrode layer 314 may have a thickness ranging from 5 nanometers (nm) to 15 nm. In one embodiment, the first top electrode layer 314 may have a thickness of about 15 nm or less. In flows that only form the first top electrode layer 314, it may be difficult to increase the first top electrode layer 314 greater than 15 nm owing to the height of the partial stack to be etched at word-line definition, coupled with mechanical weakness of the phase-change material and a desire to reliably separate adjacent word-lines. The first top electrode layer 314 may have other suitable thicknesses in other embodiments.

Referring to FIGS. 4A-C, the PCM device 300 is depicted subsequent to word-line definition. The word-line definition may be accomplished, for example, by using a patterning process such as lithography and/or etch processes to selectively remove portions of the stack of layers to provide lines 316 of the stack of layers on the underlying circuitry 302 with trenches 315 between the lines 316, as can be seen. The trenches 315 may separate PCM elements from one another. In FIG. 4B, the word-line metal 304 is patterned such that the word-line extends in a direction in and out of the page.

In FIG. 4C, the word-line metal 304 is disposed beneath the first top electrode layer 314 and extends in a direction from left to right across the page.

Referring to FIGS. 5A-C, the PCM device 300 is depicted subsequent to depositing dielectric material to fill a region between the lines 316. For example, in the depicted embodiment, a dielectric liner 318 may be conformally deposited on surfaces of the stack of layers (e.g., on the lines 316), on the word-line metal 304 and on the circuitry 302, as can be seen. A dielectric fill material 320 may be deposited to fill the region between the lines 316 using any suitable technique. In some embodiments, the dielectric liner 318 may be composed of silicon nitride ($Si_3N_4$ or in general $Si_xN_y$, where x and y represent any suitable relative quantity) and the dielectric fill material 320 may be composed of silicon oxide ($SiO_2$). The dielectric liner 318 and the dielectric fill material 320 may be composed of other suitable materials in other embodiments.

Figure 6A:
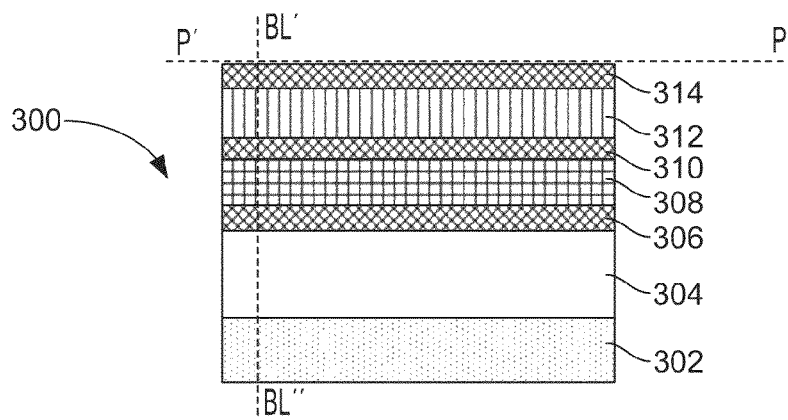
Figure 6B:
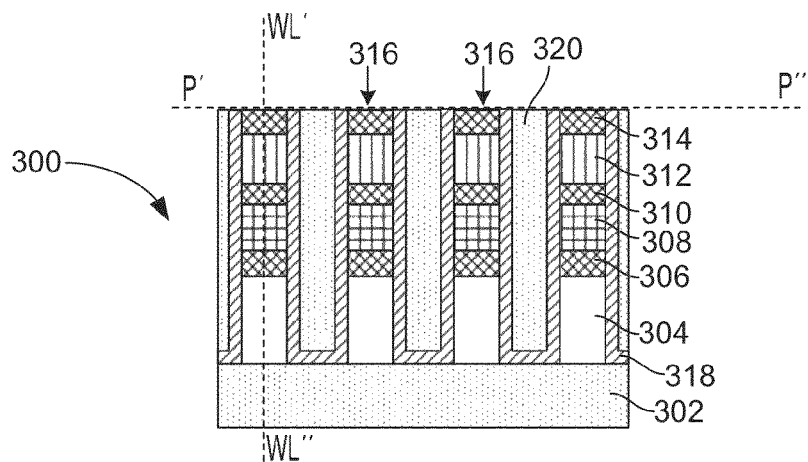
Figure 6C:
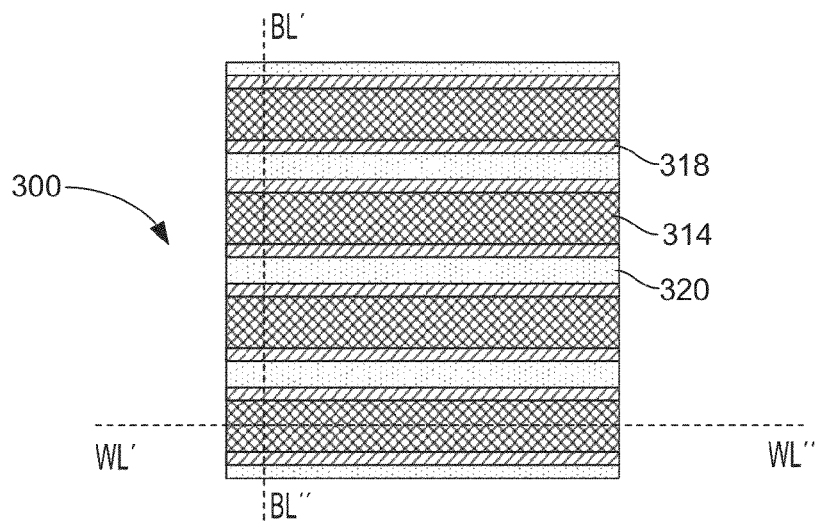

Referring to FIGS. 6A-C, the PCM device 300 is depicted subsequent to recessing the dielectric material (e.g., dielectric fill material 320 and dielectric liner 318) to expose the first top electrode layer 314. In some embodiments, a planarizing process such as, for example, chemical-mechanical polish (CMP) may be used to recess the dielectric material. Other suitable techniques to recess the dielectric material may be used in other embodiments.

Figure 7A:
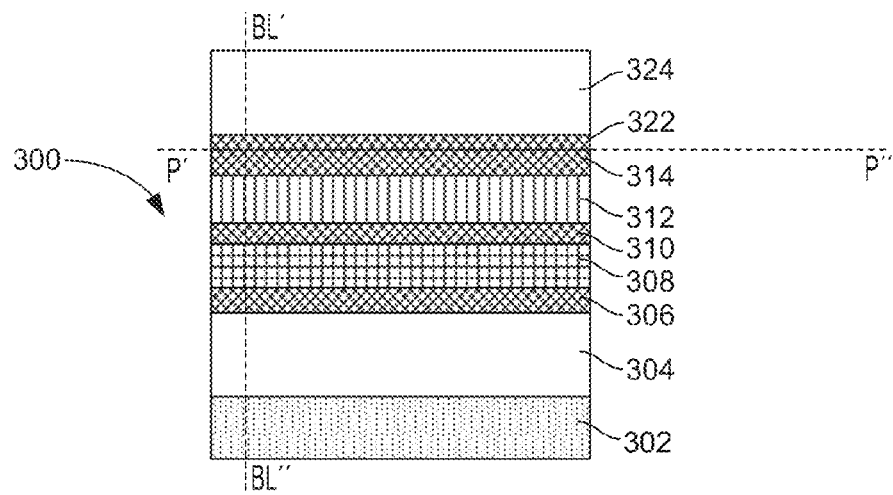
Figure 7B:
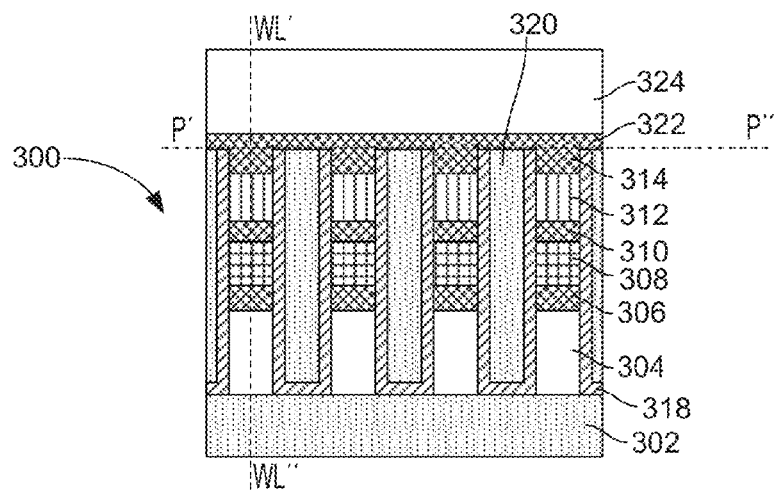
Figure 7C:
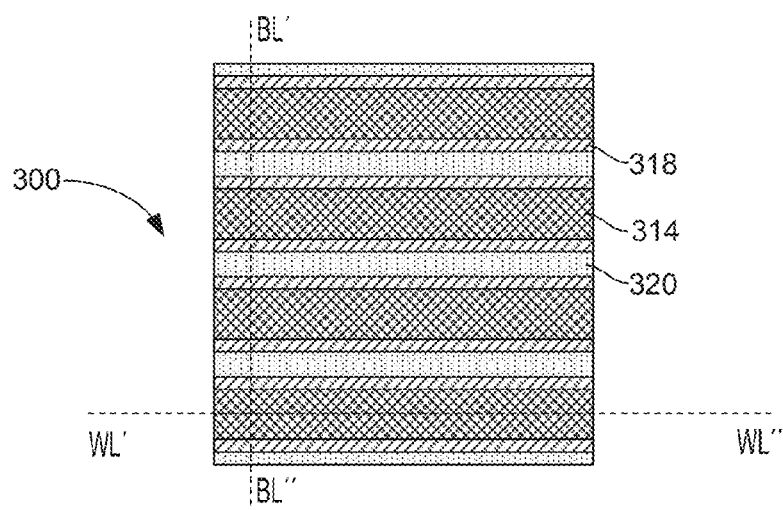

Referring to FIGS. 7A-C, the PCM device 300 is depicted subsequent to depositing a second top electrode (TE2) layer 322 on the first top electrode layer 314 and depositing a bit-line metal 324 on the second top electrode layer 322 to form a bit-line layer. In some embodiments, the second top electrode layer 322 may be deposited on portions of the dielectric liner 318 and the dielectric fill material 320, as can be seen in FIG. 7B. According to various embodiments, the second top electrode layer 322 may be deposited using, for example, physical vapor deposition (PVD) or chemical vapor deposition, among other suitable techniques. The second top electrode layer 322 may be composed of an electrically conductive material such as a metal or semi-metal having a resistivity ranging from 1 milli-Ohm·centimeter (mOhm·cm) to 100 mOhm·cm. In some embodiments, the second top electrode layer 322 may include one or more conductive and semiconductive materials such as, for example, carbon (C), carbon nitride ($C_xN_y$); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; and conductive metal oxides including $RuO_2$. The second top electrode layer 322 may be suitably integrated (e.g., etched, cleaned and sealed) into the fabrication process flow and may demonstrate good adhesion with the first top electrode layer 314 and/or the bit-line metal 324. In some embodiments, the second top electrode layer 322 may have a same chemical composition as the first top electrode layer 314. In other embodiments, the second top electrode layer 322 may have a different chemical composition than the first top electrode layer 314. The second top electrode layer 322 may be composed of other suitable materials and/or may have other suitable properties in other embodiments.

In some embodiments, the second top electrode layer 322 may have a thickness ranging from 5 nanometers (nm) to 40 nm. In one embodiment, the second top electrode layer 322 may have a thickness of about 15 nm. The second top electrode layer 322 may be composed of other suitable materials, may be deposited by other suitable techniques and/or may have other suitable thicknesses in other embodiments. The bit-line metal 324 may be composed of any suitable metal including, for example, tungsten and may be deposited using any suitable technique.

Figure 8A:
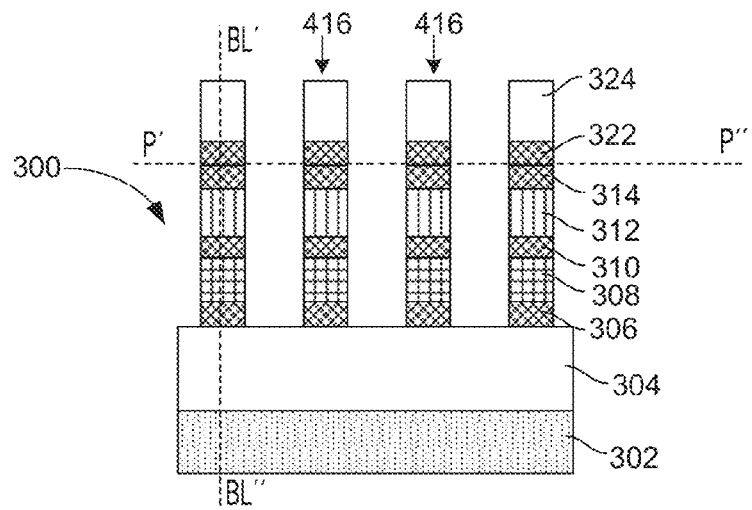
Figure 8B:
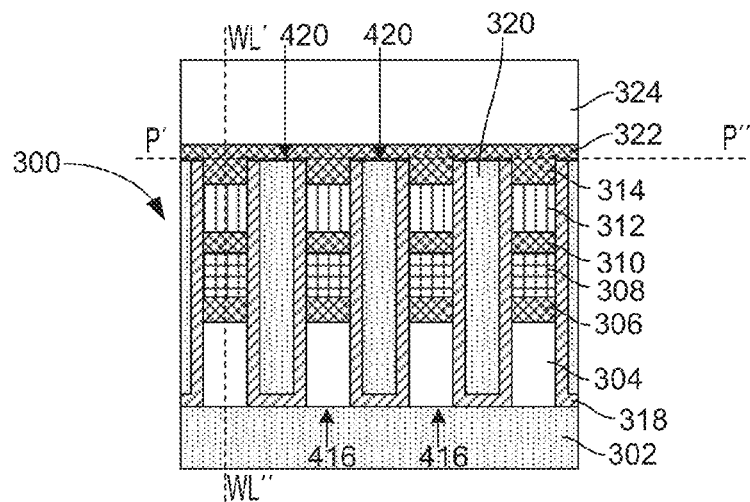
Figure 8C:
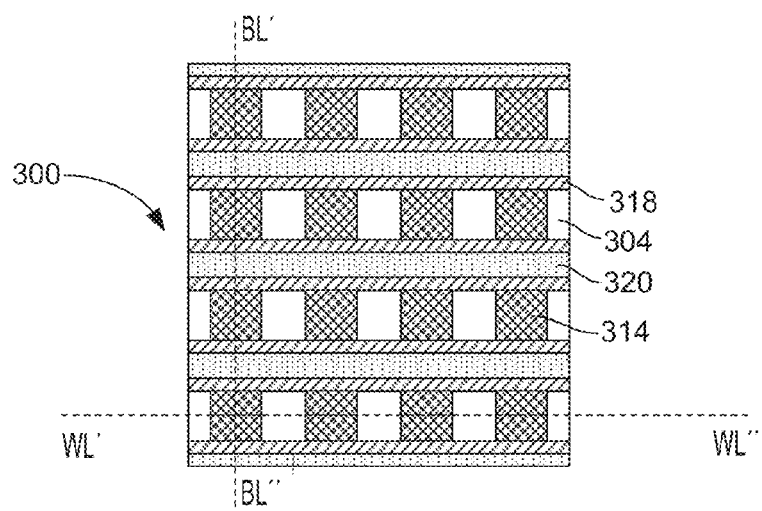

Referring to FIGS. 8A-C, the PCM device 300 is depicted subsequent to bit-line definition. Bit-line definition may be accomplished using patterning processes such as, for example, lithography and/or etch processes to selectively remove portions of the bit-line metal 324, the second top electrode 322, and the stack of layers 306, 308, 310, 312, 314 to provide individual PCM elements 416 of an array of PCM elements on the underlying circuitry 302, as can be seen. In FIG. 8A, the bit-line metal 324 extends in a direction in and out of the page. In FIG. 8B, the bit-line metal 324 is patterned such that the bit-line extends in a direction from left to right across the page, perpendicular to the word-lines.

In some embodiments, the second top electrode layer 322 may be disposed on and in direct contact with the first top electrode layer 314, as can be seen. The bit-line metal 324 may be disposed on and in direct contact with the second top electrode layer 322. In some embodiments, individual PCM elements 416 including the stack of layers (e.g., PM layer 312) may be separated by electrically insulative pillars 420. In the depicted embodiment, the electrically insulative pillars 420 include the dielectric materials 318, 320. As can be seen in FIG. 8B, material of the second top electrode layer 322 is disposed between the bit-line metal 324 and the electrically insulative pillars 420. For example, in the vertical direction (e.g., a direction parallel with a height of the individual PCM elements 416), material of the second top electrode layer 322 is disposed directly between the electrically insulative pillars 420 and the bit-line metal 324. Material of the first top electrode layer 314 may be disposed directly between (e.g., in a horizontal direction perpendicular to the vertical direction) adjacent pillars of the electrically insulative pillars 420, as can be seen. The material of the first top electrode layer 314 may not be disposed directly between the electrically insulative pillars 420 and the bit-line metal 324 in some embodiments.

Forming the second top electrode layer 322 on the first top electrode layer 314 may increase a comprehensive thickness (e.g., beyond ~15 nm) of the top electrode of the individual PCM elements 416. Techniques and configurations described herein may overcome challenges associated with increasing the top electrode thickness beyond 15 nm due to the height of the partial stack to be etched at word-line definition together with mechanical weakness of the phase-change material itself and an ability to reliably separate adjacent word-lines. Previously, these challenges may have constrained optimization of the phase material operation in terms of programming current and/or shape of the VT-I characteristic. The presently described fabrication techniques and PCM configurations may provide a thicker top electrode to overcome such constraints to allow further optimization of operation. For example, a height of the partial stack to be etched at word-line definition may not be increased. In this manner, mechanical stability of the stack may not be compromised, which may avoid shorts during word-line definition. In some embodiments, a total thickness of the top electrode (e.g., thickness of TE1 may be more than doubled compared with a flow that only forms TE1. For example, in some embodiments, the total thickness of TE1+TE2 may be about 25-40 nm. In some embodiments, the second top electrode layer 322 may provide a reliable, continuous etch stop during bit-line definition (e.g., etching of the bit-line metal 324), which may allow use of a thicker bit-line metal 324, which may reduce bit-line resistance for better current delivery in the whole array.

Figure 9A:
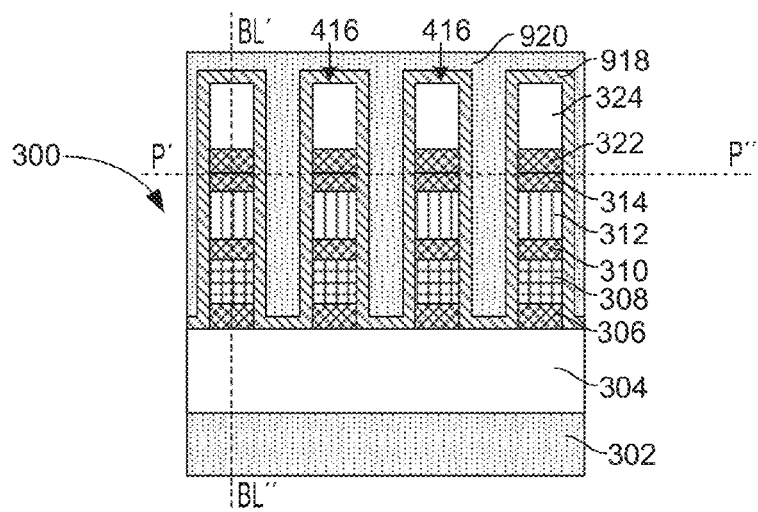
Figure 9B:
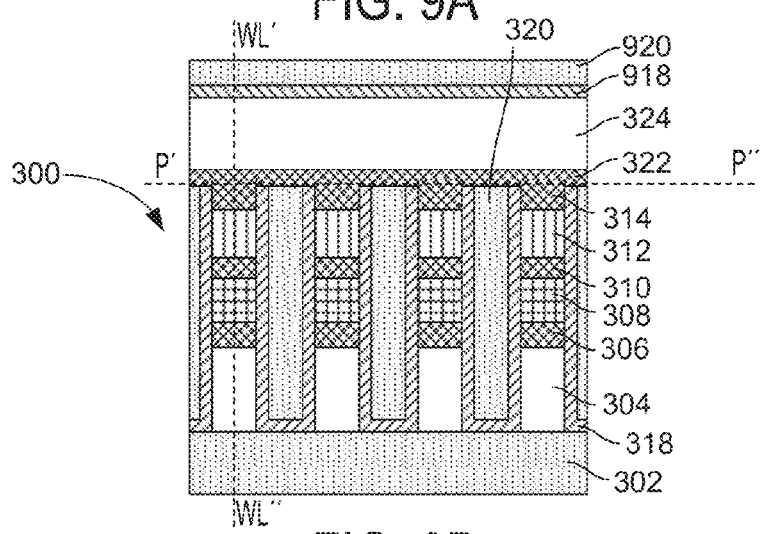
Figure 9C:
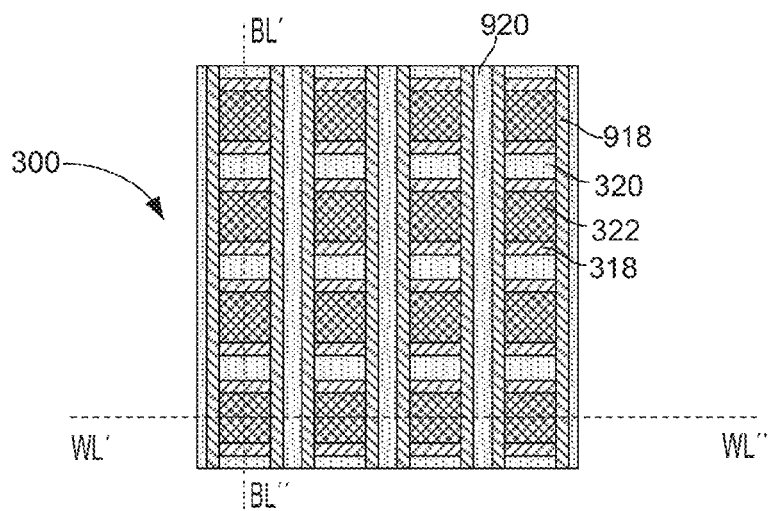

Referring to FIGS. 9A-C, the PCM device 300 is depicted subsequent to bit-line sealing and filling. As can be seen in FIGS. 9A-B, a dielectric liner 918 may be conformally deposited on the individual PCM elements 416 and on the word-line metal 304. A dielectric fill material 920 may be deposited on the dielectric liner 918 to fill a region between the individual PCM elements 416. In some embodiments, the dielectric liner 918 and dielectric fill material 920 may comport with embodiment described in connection with the dielectric liner 318 and the dielectric fill material 320, respectively. In other embodiments, the dielectric liner 918 and dielectric fill material 920 may be composed of suitable dielectric materials other than materials used for the dielectric liner 318 and the dielectric fill material 320.

Figure 10A:
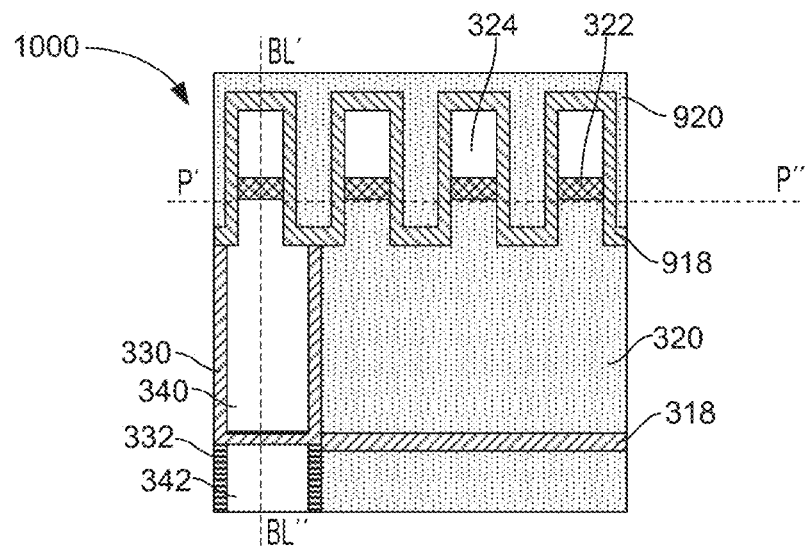
Figure 10B:
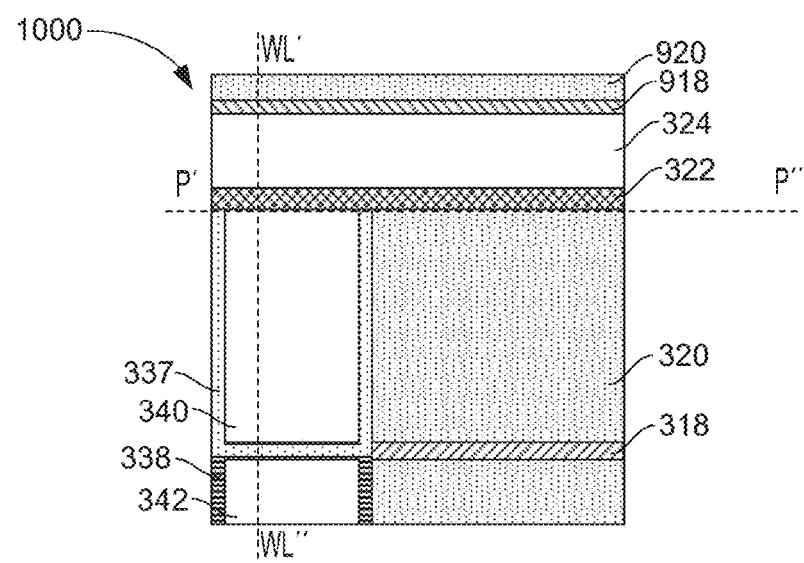

FIGS. 10A-B schematically illustrate cross-section side views of a phase-change memory (PCM) device 1000 during fabrication, in accordance with some embodiments. For example, FIGS. 10A-B may represent a same stage of fabrication as FIGS. 9A-C, that is, subsequent to bit-line sealing and filling, but for a different region of the PCM device 1000. FIGS. 9A-B and 10A-B may schematically represent cross-sections of a final product such as, for example, a memory device that is ready to be sold to a customer, according to various embodiments.

The PCM device 1000 may represent a decoding region. The decoding region may share a same plane as the individual PCM elements 416 of FIG. 9A. For example, the PCM device 1000 includes a bit-line metal 324 disposed on a second top electrode layer 322. The bit-line metal 324 and the second top electrode layer 322 of FIGS. 10A-B may be on a same plane as the bit-line metal 324 and the second top electrode layer 322 of FIGS. 9A-B. The individual PCM elements 416 of FIG. 9A may be in or out of the page relative to the PCM device 1000 depicted in FIG. 10A.

The PCM device 1000 may include a bit-line via 340 and a word-line via 342, coupled as can be seen. The bit-line via 340 and the word-line via 342 may each represent one of a plurality of vias formed in a decoding region that are in a same plane as the individual PCM elements 416 of FIG. 9A. In some embodiments, the second top electrode layer 322 may be disposed directly between the bit-line metal 324 and the bit-line via 340, as can be seen. In some embodiments, the second top electrode layer 322 may be disposed on the dielectric fill material 320, as can be seen. The dielectric fill material 320 may represent multiple layers of dielectric material in some embodiments.

Barrier liners 337 and 338 may be formed to encapsulate electrically conductive material of the respective bit-line via 340 and word-line via 342. In some embodiments, the word-line via 342 and the bit-line via 340 may each be composed of tungsten (W) and the barrier liners 337, 338 may be composed of titanium nitride (TiN) or tantalum nitride (TaN). The word-line via 342, bit-line via 340 and the barrier liners 337, 338 may be composed of other suitable materials in other embodiments.

Formation of the second top electrode layer 322 as described herein may result in the second top electrode layer 322 being present between the bit-line metal 324 and underlying vias (e.g., bit-line via 340 and word-line via 342). A thickness of the second top electrode layer 322 may be tuned to create adjustable ballast between decoders and cells on the bit-line side. In a case where the thickness and/or resistivity of the second top electrode layer 322 creates a series resistance that is too high, a loose mask may be introduced in order to remove the second top electrode layer 322 from the decoding region, possibly by over-etching of the vias at the end of bit-line metal etching. If full symmetry of carbon morphology is desired for symmetric cell operation, thickness of the bottom electrode may be adjusted (e.g., by over-etching during bit-line definition). In some embodiments resistivity of the second top electrode layer 322 may be less than 20 mOhm·cm and have a thickness less than or equal to about 15 nm to reduce impact of increasing resistance in the bit-line path. For example, for a via area equal to ~30×50 nm$^2$, a second top electrode layer 322 having resistivity and thickness as described may add resistance in the bit-line path that is lower than 2 kilo-Ohm (KOhm).

Figure 11:
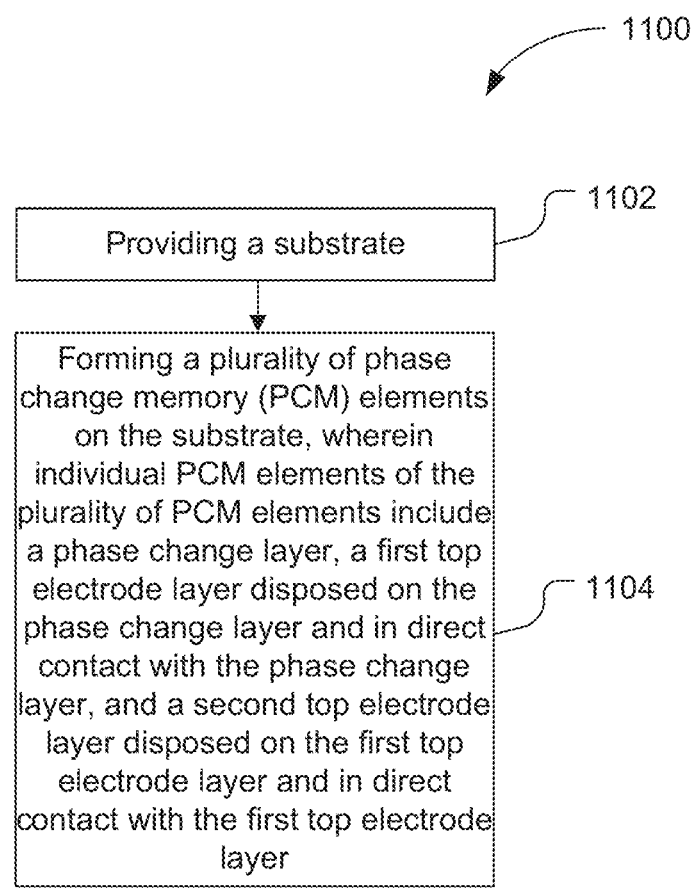
FIG. 11 is a flow diagram of a method of fabricating a PCM device, in accordance with some embodiments.

FIG. 11 is a flow diagram of a method 1100 of fabricating a PCM device (e.g., PCM device 300 of FIGS. 3A-9C), in accordance with some embodiments. The method 1100 may comport with embodiments described in connection with FIGS. 1-10B and vice versa.

At 1102, the method 1100 may include providing a substrate (e.g., substrate 301 of FIGS. 3A-B). The substrate may include, for example, a semiconductor substrate such as a silicon wafer or die.

At 1104, the method 1100 may include forming a plurality of phase-change memory (PCM) elements on the substrate, wherein individual PCM elements (e.g., individual PCM elements 416 of FIGS. 8A-B) of the plurality of PCM elements include a phase-change material layer (e.g., PM layer 312 of FIGS. 3A-9C), a first top electrode layer (e.g., first top electrode layer 314 of FIGS. 3A-9C) disposed on the phase-change layer and in direct contact with the phase-change layer, and a second top electrode layer (e.g., second top electrode layer 322 of FIGS. 7A-9C) disposed on the first top electrode layer and in direct contact with the first top electrode layer.

According to various embodiments, forming the plurality of PCM elements on the substrate may include forming a stack of layers. For example, the stack of layers may be formed by depositing a word-line layer (e.g., word-line metal 304 of FIGS. 3A-B) on the substrate, depositing a bottom electrode layer (e.g., bottom electrode layer 306 of FIGS. 3A-B) on the word-line layer, depositing a select device layer (e.g., select device layer 308 of FIGS. 3A-B) on the bottom electrode layer, depositing a middle electrode layer (e.g., middle electrode layer 310 of FIGS. 3A-B) on the select device layer, depositing a phase-change material layer (e.g., phase-change material layer 312 of FIGS. 3A-B) on the middle electrode layer, and depositing a first top electrode layer (e.g., first top electrode layer 314 of FIGS. 3A-B) on the phase-change material layer.

The stack of layers may be patterned to provide the individual PCM elements. Patterning may include, for example, lithography and/or etch processes. For example, word-line definition as described in connection with FIGS. 4A-C may be performed and/or bit-line definition as described in connection with FIGS. 8A-C may be performed to provide the individual PCM elements.

In some embodiments, dielectric material may be deposited to fill a region between the individual PCM elements. For example, a dielectric liner (e.g., dielectric liner 318) may be conformally deposited on the stack of layers of the individual PCM elements and a dielectric fill material (e.g., dielectric fill material 320) may be deposited to fill a remaining region between the individual PCM elements.

In some embodiments, techniques described in connection with FIGS. 5A-C may be performed to deposit dielectric material. The dielectric material may be recessed to expose the first top electrode layer using, for example, techniques described in connection with FIGS. 6A-C. In some embodiments, the second top electrode layer may be deposited on the first top electrode layer using, for example, techniques described in connection with FIGS. 7A-C. A bit-line layer may be deposited on the second top electrode layer using, for example, techniques described in connection with FIGS. 7A-C.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 12:
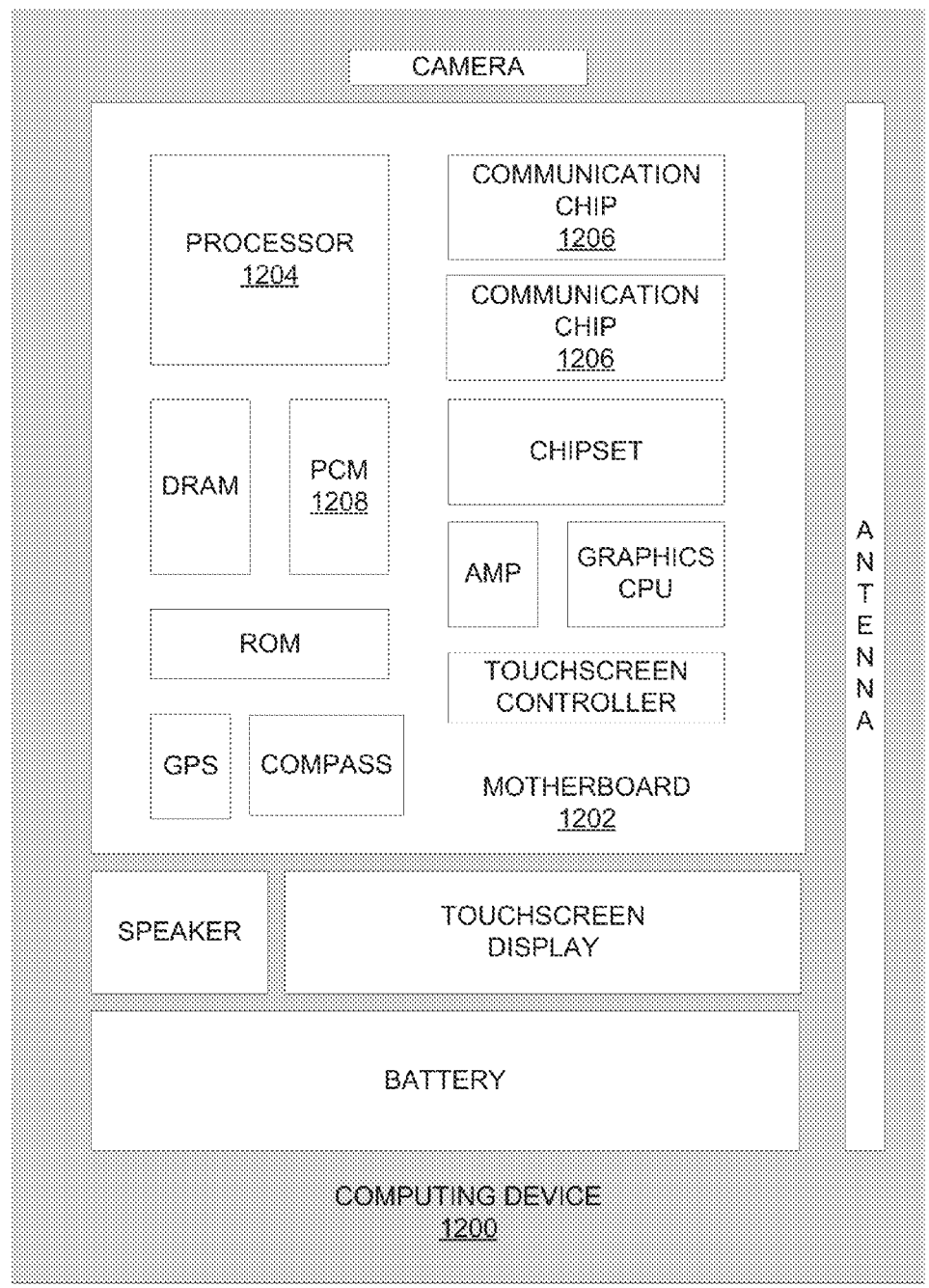
FIG. 12 schematically illustrates an example system that includes a PCM device in accordance with various embodiments described herein.

Embodiments of the present disclosure may be implemented into a system using any suitable hardware and/or software to configure as desired. FIG. 12 schematically illustrates an example system (e.g., a computing device 1200) that includes a PCM device (e.g., PCM device 300 of FIGS. 3A-9C) in accordance with various embodiments described herein. The computing device 1200 may house a board such as motherboard 1202. The motherboard 1202 may include a number of components, including but not limited to a processor 1204 and at least one communication chip 1206. The processor 1204 may be physically and electrically coupled to the motherboard 1202. In some implementations, the at least one communication chip 1206 may also be physically and electrically coupled to the motherboard 1202. In further implementations, the communication chip 1206 may be part of the processor 1204.

Depending on its applications, computing device 1200 may include other components that may or may not be physically and electrically coupled to the motherboard 1202. These other components may include, but are not limited to, volatile memory (e.g., DRAM), non-volatile memory (e.g., PCM 1208 or ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

According to various embodiments, the PCM 1208 may comport with embodiments described herein. For example, the PCM 1208 may include a PCM device (e.g., PCM device 300 of FIGS. 3A-9C) as described herein.

The communication chip 1206 may enable wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1206 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1206 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1206 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1206 may operate in accordance with other wireless protocols in other embodiments.

The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, EV-DO, and others.

In various implementations, the computing device 1200 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLES

According to various embodiments, the present disclosure describes an apparatus. Example 1 of an apparatus may include a plurality of phase-change memory (PCM) elements, wherein individual PCM elements of the plurality of PCM elements include: a phase-change material layer; a first electrode layer disposed on the phase-change material layer and in direct contact with the phase-change material layer; and a second electrode layer disposed on the first electrode layer and in direct contact with the first electrode layer. Example 2 may include the apparatus of Example 1, wherein the individual PCM elements of the plurality of PCM elements further include a bit-line disposed on the second electrode layer and in direct contact with the second electrode layer. Example 3 may include the apparatus of Example 2, wherein the individual PCM elements of the plurality of PCM elements are separated by electrically insulative pillars and material of the second electrode layer is disposed between the bit-line and the electrically insulative pillars. Example 4 may include the apparatus of Example 3, wherein material of the first electrode layer is disposed between adjacent pillars of the electrically insulative pillars. Example 5 may include the apparatus of any of Examples 2-4, wherein the individual PCM elements of the plurality of PCM elements further include: a word-line; a select device layer; a third electrode layer disposed between the select device layer and the phase-change material layer; and a fourth electrode layer disposed between the word-line and the select device layer. Example 6 may include the apparatus of any of Examples 2-4, further comprising a plurality of vias disposed in a decoding region that is in a same plane as the individual PCM elements, wherein the second electrode layer is disposed between the bit-line and a via of the plurality of vias. Example 7 may include the apparatus of any of Examples 1-4, wherein the first electrode layer and the second electrode layer have a different chemical composition and the first electrode layer and the second electrode layer have a resistivity from 1 milli-Ohm·centimeter (mOhm·cm) to 100 mOhm·cm. Example 8 may include the apparatus of any of Examples 1-4, wherein the second electrode layer is configured to serve as an etch stop layer for bit-line definition.

According to various embodiments, the present disclosure describes a method. Example 9 of a method may include providing a substrate and forming a plurality of phase-change memory (PCM) elements on the substrate, wherein individual PCM elements of the plurality of PCM elements include: a phase-change material layer; a first top electrode layer disposed on the phase-change material layer and in direct contact with the phase-change material layer; and a second top electrode layer disposed on the first top electrode layer and in direct contact with the first top electrode layer. Example 10 may include the method of Example 9, wherein forming the plurality of PCM elements comprises forming a stack of layers by: depositing a word-line layer on the substrate; depositing a bottom electrode layer on the word-line layer; depositing a select device layer on the bottom electrode layer; depositing a middle electrode layer on the select device layer; depositing the phase-change material layer on the middle electrode layer; and depositing the first top electrode layer on the phase-change material layer; and patterning the stack of layers to provide the individual PCM elements. Example 11 may include the method of Example 10, further comprising depositing dielectric material to fill a region between the individual PCM elements. Example 12 may include the method of Example 11, wherein depositing the dielectric material comprises conformally depositing a dielectric liner on the individual PCM elements and depositing a dielectric material on the dielectric liner to fill the region between the individual PCM elements. Example 13 may include the method of Example 11, further comprising recessing the dielectric material to expose the first top electrode layer. Example 14 may include the method of Example 13, further comprising depositing the second top electrode layer on the first top electrode layer. Example 15 may include the method of Example 14, further comprising depositing a bit-line layer on the second top electrode layer. Example 16 may include the method of Example 15, wherein material of the second top electrode layer is disposed between the bit-line layer and the dielectric material.

According to various embodiments, the present disclosure describes a system. Example 17 of a system may include a circuit board and a die coupled with the circuit board, the die comprising a plurality of phase-change memory (PCM) elements, wherein individual PCM elements of the plurality of PCM elements include: a phase-change material layer; a first electrode layer disposed on the phase-change material layer and in direct contact with the phase-change material layer; and a second electrode layer disposed on the first electrode layer and in direct contact with the first electrode layer. Example 18 may include the system of Example 17, wherein the individual PCM elements of the plurality of PCM elements further include a bit-line disposed on the second electrode layer and in direct contact with the second electrode layer. Example 19 may include the system of Example 18, wherein the individual PCM elements of the plurality of PCM elements are separated by electrically insulative pillars and material of the second electrode layer is disposed between the bit-line and the electrically insulative pillars. Example 20 may include the system of any of Examples 17-19, wherein the system is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
   a plurality of phase-change memory (PCM) elements, wherein individual PCM elements of the plurality of PCM elements are separated by electrically insulative pillars, and include:
   a bit line;
   a first electrode layer disposed between adjacent electrically insulative pillars, substantially co-planar with top surfaces of the adjacent electrically insulative pillars; and
   a second electrode layer disposed directly between the top surfaces of the adjacent electrically insulative pillars and the bit line, and further disposed to provide direct contact with the first electrode layer.

2. The apparatus of claim 1, wherein a combined thickness of the first and second electrode layers is equal to or greater than 15 nm.

3. The apparatus of claim 1, wherein individual PCM elements of the plurality of PCM elements further include a phase-change material layer disposed between the adjacent electrically insulative pillars, wherein the first electrode layer is further disposed on the phase-change material layer.

4. The apparatus of claim 3, wherein the individual PCM elements further include a third electrode layer, wherein the phase-change material layer is disposed on the third electrode layer.

5. The apparatus of claim 4, wherein the individual PCM elements further include a select device layer, wherein the third electrode layer is disposed between the select device layer and the phase-change material layer.

6. The apparatus of claim 5, wherein the individual PCM elements further include a fourth electrode layer, wherein the select device layer is disposed on the fourth electrode layer.

7. The apparatus of claim 6, wherein the individual PCM elements further include a word line, wherein the fourth electrode layer is disposed on the word line.

8. The apparatus of claim 7, wherein the individual PCM elements further include:
a substrate; and
a circuitry layer disposed on the substrate,
wherein the word line is disposed on the circuitry layer.

9. The apparatus of claim 1, wherein the first electrode layer and the second electrode layer have a different chemical composition, and wherein the first electrode layer and the second electrode layer have a resistivity from 1 milli-Ohm·centimeter (mOhm·cm) to 100 mOhm·cm.

10. The apparatus of claim 1, wherein the second electrode layer is to serve as an etch stop layer for bit-line definition.

11. A method comprising:
providing a substrate; and
forming a plurality of phase-change memory (PCM) elements on the substrate, wherein forming the plurality of PCM elements includes disposing individual PCM elements on the substrate, including:
forming electrically insulative pillars, to separate the individual PCM elements;
disposing a first electrode layer between adjacent electrically insulative pillars, wherein disposing includes forming the first electrode layer to be substantially co-planar with top surfaces of the adjacent electrically insulative pillars; and
disposing a second electrode layer directly over the top surfaces of the adjacent electrically insulative pillars, to provide direct contact with the first electrode layer.

12. The method of claim 11, wherein forming the plurality of PCM elements further includes: disposing a bit line on top of the second electrode layer, to provide direct contact between the bit line and the second electrode layer.

13. The method of claim 12, wherein forming the plurality of PCM elements further includes forming a stack of layers of the PCM, which includes:
depositing a word-line layer on the substrate;
depositing a bottom electrode layer on the word-line layer;
depositing a select device layer on the bottom electrode layer;
depositing a middle electrode layer on the select device layer; and
depositing a phase-change material layer on the middle electrode layer; and
patterning the stack of layers to provide the individual PCM elements,
wherein disposing a first electrode layer includes depositing the first electrode layer on the phase-change material layer.

14. The method of claim 12, wherein forming electrically insulative pillars includes depositing dielectric material to fill regions between the individual PCM elements.

15. The method of claim 14, wherein depositing the dielectric material comprises:
conformally depositing a dielectric liner on the individual PCM elements; and
depositing the dielectric material on the dielectric liner to fill the regions between the individual PCM elements.

16. The method of claim 15, further comprising:
recessing the dielectric material to expose the first electrode layer,
wherein disposing a second electrode layer comprises depositing the second electrode layer on the first electrode layer.

17. A system comprising:
a circuit board, and a die coupled with the circuit board, the die comprising:
a plurality of phase-change memory (PCM) elements, wherein individual PCM elements of the plurality of PCM elements are separated by electrically insulative pillars, and include:
a bit line;
a first electrode layer disposed between adjacent electrically insulative pillars, substantially co-planar with top surfaces of the adjacent electrically insulative pillars; and
a second electrode layer disposed directly between the top surfaces of the adjacent electrically insulative pillars and the bit line, and further disposed to provide direct contact with the first electrode layer,
wherein the system further includes one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

18. The system of claim 17, wherein individual PCM elements of the plurality of PCM elements further include a phase-change material layer disposed between the adjacent electrically insulative pillars, wherein the first electrode layer is further disposed on the phase-change material layer.

19. The system of claim 17, wherein a combined thickness of the first and second electrode layers is equal to or greater than 15 nm.

20. The system of claim 17, wherein the system is a mobile computing device.

* * * * *